United States Patent
Aude

(10) Patent No.: US 6,987,477 B1
(45) Date of Patent: Jan. 17, 2006

(54) PIPELINED ANALOG-TO-DIGITAL CONVERTER (ADC) WITH 3-BIT ADC AND ENDPOINT CORRECTION

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/958,093

(22) Filed: Oct. 4, 2004

(51) Int. Cl.
*H03M 1/38* (2006.01)

(52) U.S. Cl. .................................. 341/161; 341/155

(58) Field of Classification Search ............... 341/161, 341/110, 120, 136, 155, 156
See application file for complete search history.

(56) References Cited

U.S. PATENT DOCUMENTS

| | | | |
|---|---|---|---|
| 6,133,864 A | * | 10/2000 | Sabatini ..................... 341/141 |
| 6,195,032 B1 | * | 2/2001 | Watson et al. ............... 341/162 |
| 6,710,732 B1 | | 3/2004 | Aude |

* cited by examiner

*Primary Examiner*—Brian Young
(74) *Attorney, Agent, or Firm*—Vedder Price Kaufman & Kammholz, P.C.

(57) ABSTRACT

A pipelined analog-to-digital converter (ADC) in which one less pipeline stage is needed while the output ADC stage has its resolution increased by one bit, thereby advantageously providing for decreased circuit area, lower power consumption and endpoint correction, with minimal additional circuitry.

15 Claims, 7 Drawing Sheets

PIPELINED ANALOG-TO-DIGITAL CONVERTER (ADC) WITH 3-BIT ADC AND ENDPOINT CORRECTION

BACKGROUND OF THE INVENTION

1. Field of the Invention

The present invention relates to analog-to-digital converter (ADC) circuits, and in particular to pipelined ADCs.

2. Description of the Related Art

Many forms of digital signal processing systems require data conversion devices to quantize analog data signals for use in the digital signal processing. Such data conversion devices often include an ADC. One type of ADC which is often used is a pipelined ADC.

SUMMARY OF THE INVENTION

In accordance with the presently claimed invention, a pipelined analog-to-digital converter (ADC) is provided in which one less pipeline stage is needed while the output ADC stage has its resolution increased by one bit, thereby advantageously providing for decreased circuit area, lower power consumption and endpoint correction, with minimal additional circuitry.

In accordance with one embodiment of the presently claimed invention, a pipelined analog-to-digital converter (ADC) includes a plurality of pipeline stages coupled in series and including a first pipeline stage, at least one intermediate pipeline stage and a last pipeline stage, each of which provides M bits of resolution for an N-bit digital output signal corresponding to an analog input signal, and a final ADC. The first pipeline stage is responsive to the analog input signal by providing a first analog residue signal and a first digital signal with M+1 bits corresponding to M+1 most significant bits (MSBs) of the N-bit digital output signal. Each of the at least one intermediate pipeline stage is responsive to a prior analog residue signal by providing a subsequent analog residue signal and an intermediate digital signal with M+1 bits corresponding to M+1 less significant intermediate bits of the N-bit digital output signal. The last pipeline stage is responsive to a last subsequent analog residue signal by providing a final analog residue signal and a last digital signal with M+1 bits corresponding to M+1 lesser significant intermediate bits of the N-bit digital output signal. The final ADC is coupled to the last pipeline stage and responsive to the final analog residue signal by providing a final digital signal with 2M+1 bits corresponding to 2M+1 least significant bits (LSBs) of the N-bit digital output signal.

In accordance with another embodiment of the presently claimed invention, a pipelined analog-to-digital converter (ADC) includes pipeline means and final ADC means. First pipeline means is for receiving an analog input signal and in response thereto generating a first analog residue signal and a first digital signal with M+1 bits corresponding to M+1 most significant bits (MSBs) of an N-bit digital output signal. Each of at least one intermediate pipeline means is for receiving a prior analog residue signal and in response thereto generating a subsequent analog residue signal and an intermediate digital signal with M+1 bits corresponding to M+1 less significant intermediate bits of the N-bit digital output signal. Last pipeline means is for receiving a last subsequent analog residue signal and in response thereto generating a final analog residue signal and a last digital signal with M+1 bits corresponding to M+1 lesser significant intermediate bits of the N-bit digital output signal. The final ADC means is for receiving the final analog residue signal and in response thereto generating a final digital signal with 2M+1 bits corresponding to 2M+1 least significant bits (LSBs) of the N-bit digital output signal.

In accordance with still another embodiment of the presently claimed invention, a pipelined analog-to-digital converter (ADC) includes first, second, third and fourth 1.5-bit pipeline stages coupled in series, each of which provides one bit of resolution for a 7-bit digital output signal corresponding to an analog input signal, and a final ADC. The first pipeline stage is responsive to the analog input signal by providing a first analog residue signal and a first digital signal with 2 bits corresponding to a most significant bit (MSB) of the 7-bit digital output signal. The second and third pipeline stages are responsive to the first analog residue signal and a second analog residue signal by providing the second analog residue signal and a third analog residue signal and second and third digital signals with 2 bits, respectively, corresponding to second and third less significant bits of the 7-bit digital output signal. The fourth pipeline stage is responsive to the third analog residue signal by providing a fourth analog residue signal and a fourth digital signal with 2 bits corresponding to a fourth less significant bit of the 7-bit digital output signal. The final ADC is coupled to the fourth pipeline stage and responsive to the fourth analog residue signal by providing a fifth digital signal with three bits corresponding to three least significant bits (LSBs) of the 7-bit digital output signal.

In accordance with yet another embodiment of the presently claimed invention, a pipelined analog-to-digital converter (ADC) includes pipeline means and final ADC means. First pipeline means is for receiving an analog input signal and in response thereto generating a first analog residue signal and a first digital signal with 2 bits corresponding to a most significant bit (MSB) of a 7-bit digital output signal. Second and third pipeline means are for receiving the first analog residue signal and a second analog residue signal and in response thereto generating the second analog residue signal and a third analog residue signal and second and third digital signals with 2 bits, respectively, corresponding to second and third less significant bits of the 7-bit digital output signal. Fourth pipeline means is for receiving the third analog residue signal and in response thereto generating a fourth analog residue signal and a fourth digital signal with 2 bits corresponding to a fourth less significant bit of the 7-bit digital output signal. The final ADC means is for receiving the fourth analog residue signal and in response thereto generating a fifth digital signal with three bits corresponding to three least significant bits (LSBs) of the 7-bit digital output signal.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
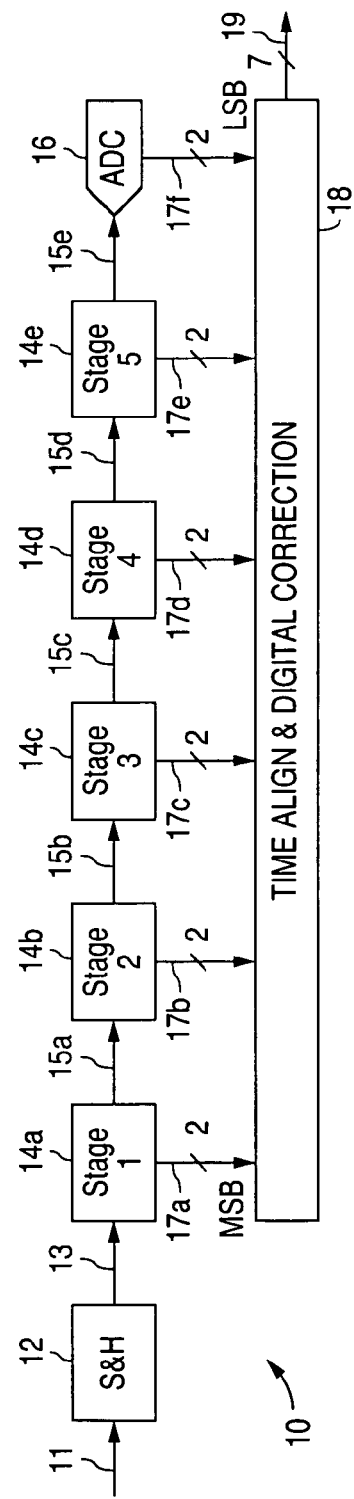
FIG. 1 is a block diagram of a conventional pipelined ADC circuit.

Referring to FIG. 1, a conventional pipelined ADC 10 includes a sample and hold stage 12, multiple stages 14 of sub-converters (discussed in more detail below), a final ADC 16, and a digital stage 18 that performs time alignment and digital correction functions. As is well known in the art, an input analog signal 11 is sampled and held by the sample and hold stage 12, thereby providing a stable analog signal 13 for quantization. This signal 13 is converted by the first sub-converter stage 14a to a digital signal 17a having M+1 bits, and an analog residue signal 15a (discussed in more detail below). The digital signal 17a, while having M+1 bits, provides M bits of resolution for the final output signal 19. In this example, the number of bits in 7 and the resolution M is 1. For this first stage 14a, the digital signal 17a will correspond to the most significant bit (MSB) of the final digital output signal 19. Similar conversions are performed by the remaining sub-converter stages, 14b, 14c, 14d, 14e to provide digital signals 17b, 17c, 17d, 17e corresponding to less significant bits of the final digital output signal 19, as well as inter-stage residue signals 15b, 15c, 15d, 15e.

The final residue signal 15e is converted by the final ADC 16 to produce the last digital signal 17f which has M+1 bits of resolution corresponding to the least significant bits (LSBs) of the final digital output signal 19. As noted above, the time align and digital correction stage 18 processes the incoming digital signals 17 appropriately to provide the final digital output signal 19. (A more detailed discussion of such a conventional pipelined ADC can be found in U.S. Pat. No. 6,710,732, the disclosure of which is incorporated herein by reference.)

Figure 2:
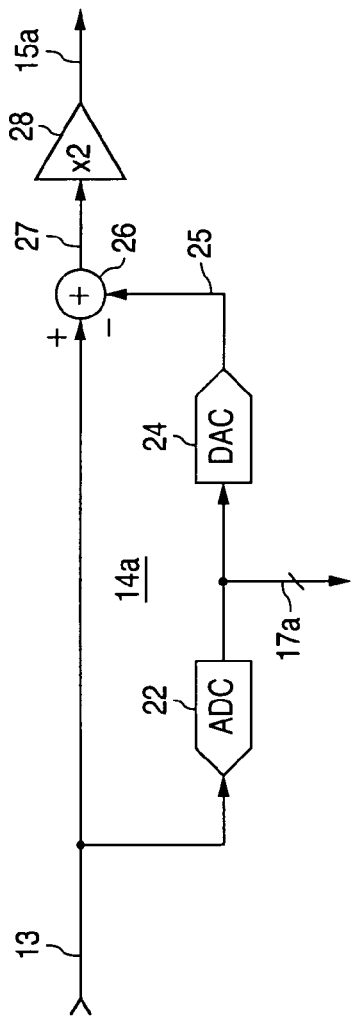
FIG. 2 is a block diagram of a conventional sub-converter for a pipelined ADC circuit.
Figure 3A:
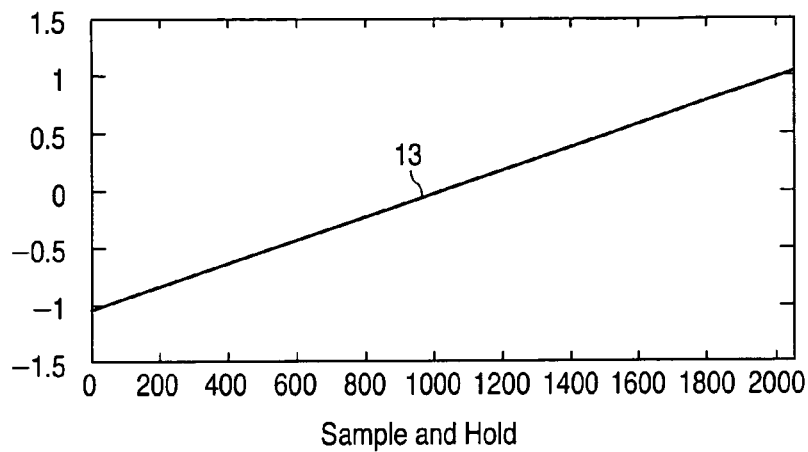
FIG. 3 illustrates the residue signal waveforms for the sub-converters of the pipelined ADC circuit of FIG. 1.
Figure 3B:
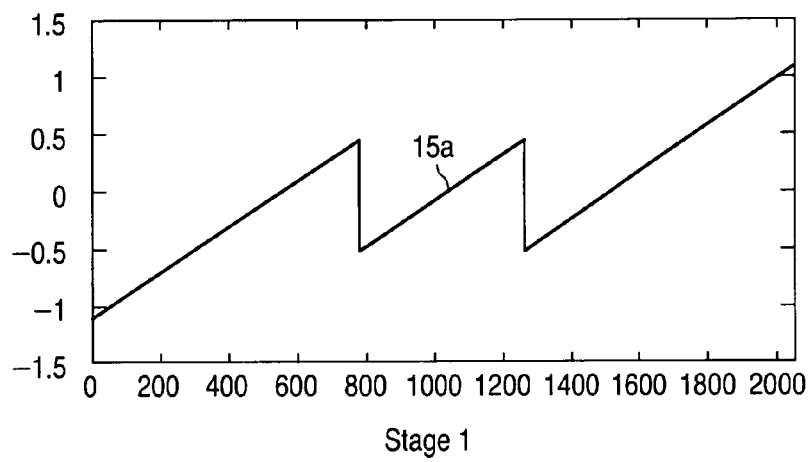
Figure 3C:
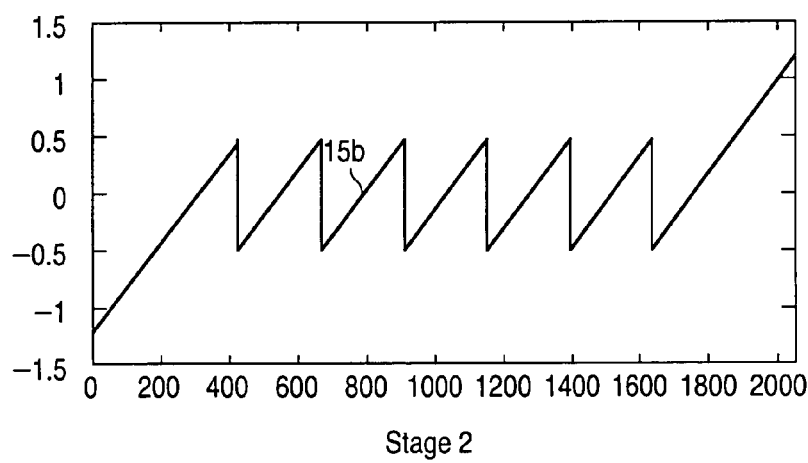
Figure 3D:
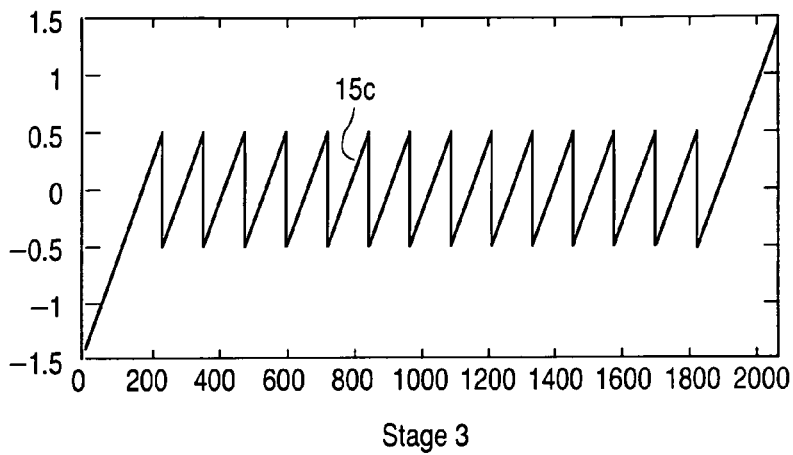
Figure 3E:
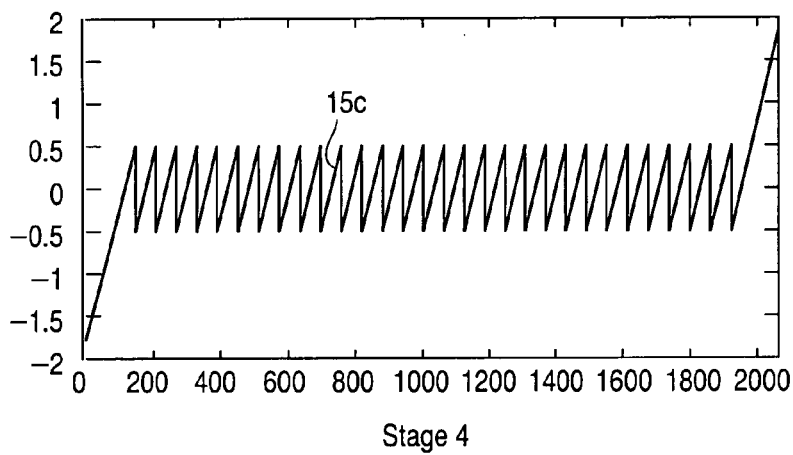
Figure 3F:
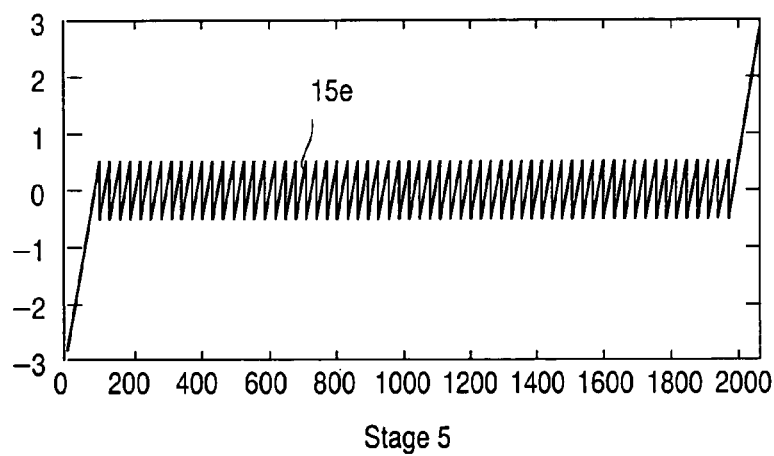

Referring to FIG. 2, using the first stage 14a of the pipelined ADC 10 of FIG. 1 as an example, each sub-converter includes an ADC 22, a digital-to-analog converter (DAC) 24, a signal combiner 26 (e.g., an adder) and an amplifier 28 with a gain of M+1, all interconnected substantially as shown. The incoming analog signal 13 is converted by the ADC 22 to the digital signal 17a. This digital signal 17a is converted by the DAC 24 back to an analog signal 25 which is subtracted from the original analog signal 13. The resultant signal 27 is amplified by the amplifier 28 to produce the residue signal 15a.

Referring to FIG. 3, the output signals 13, 15 of the sample and hold 12 and sub-converter 14 stages conform to those expected for a conventional 1.5-bit per stage architecture as used in the example circuit of FIG. 1.

Figure 4:
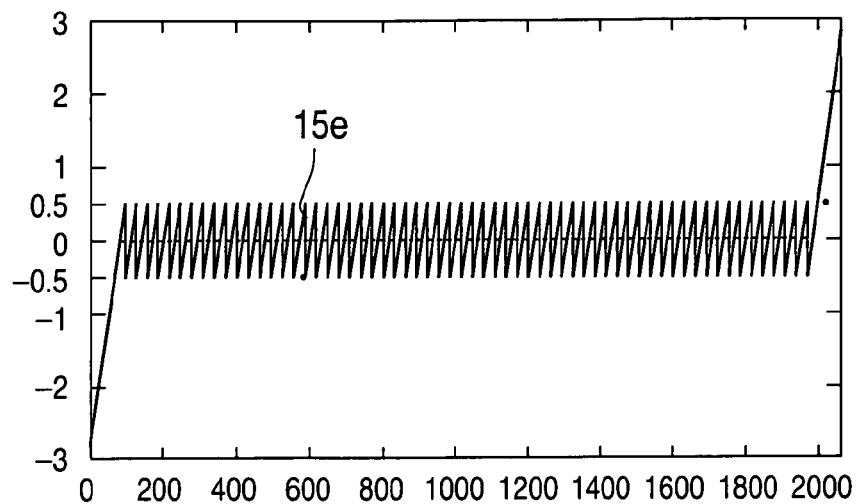
FIG. 4 illustrates the residue signal waveform for the last sub-converter of the pipelined ADC circuit of FIG. 1.

Referring to FIG. 4, the residue signal 15e of the last sub-converter stage 14e ideally has a signal which, between the endpoints, exhibits signal excursions between −0.5 and +0.5 volt. As is well known in the art, the architecture for the final ADC 16, typically a flash converter, includes three voltage comparators. Such comparators ideally have trip points, or thresholds, of +0.5, 0 and −0.5 volt (as identified by the dots in the figure). The output codes corresponding to the input signal levels are as shown below in Table 1.

TABLE 1

| Vin | Output Code |
|---|---|
| V > 0.5 | 11 |
| 0 < V < 0.5 | 10 |
| −0.5 < V < 0 | 01 |
| V < −0.5 | 00 |

As can be seen, the comparators having the +0.5 and the −0.5 volt thresholds are only used to determine two unique points for the entire residue signal i.e., those points where the signal has risen from its extreme negative value and those points where the signal rises to its extreme positive value. In other words, for example, for ideal comparators and residue signals, the output codes have a progression of values, following the initial value of 00, of 01, 10, 01, 10, and so on which repeats until the endpoint value of 11. In the event that even a small error occurs in these threshold values (e.g., +0.48 and −0.46 volt versus +0.5 and −0.5 volt, respectively), these voltage comparators would not trip at only the two correct places, but would instead trip at many more places (e.g., 128 places for this example). This will cause the normally monotonic succession of code values to now become non-monotonic, since such a pipelined architecture has no error margin for these comparators.

If the upper threshold comparator trips slightly below its ideal value of +0.5 volt, than it will generate 64 "hits" instead of only the ideal one. Accordingly, the progression of code values (following the initial value of 00) becomes 01, 10, 11, 01, and so on until the endpoint value of 11. This occurrence of an "11" code value prior to the endpoint causes the overall succession of code values to become non-monotonic. In other words, the error margin is zero for values between the positive and negative thresholds, and is infinite for values beyond the thresholds.

To overcome this problem with error margins, the comparative thresholds have traditionally been changed from +/−0.5 volt to +/−0.75 volt, thereby allowing for an error range of 0.25 volt before the code monotonicity becomes affected. As a result, the upper and lower threshold comparators now only have two unique comparison points on the entire range of residue values. For the example of a 7-bit pipelined ADC, such comparators will uniquely determine the transition from code 1 to 0 and from code 126 to 127. By extending these threshold values in this matter, the differential non-linearity (DNL) for these two codes increases from zero for the ideal case of +/−0.5 volt thresholds to 0.5 for the case of +/−0.75 volt thresholds. The corresponding output code values for the range of input voltages are as shown below in Table 2:

TABLE 2

| Vin | Output Code |
|---|---|
| V > 0.75 | 11 |
| 0 < V < 0.75 | 10 |
| −0.75 < V < 0 | 01 |
| V < −0.75 | 00 |

As noted above, the conventional two-bit flash ADC has a DNL error of 0.5 bits at the endpoints. However, this can be remedied by ignoring the results from the two unique comparison points on the residue plot for the upper and lower threshold (+/−0.5 volt) comparators except when needed. If the results of these comparators are ignored entirely, the flash ADC will output only a 10 or 01 code, thereby restricting the digital range to 1–126 instead of 0–127. Accordingly, the outputs are ignored except if the code is 1 or 126, since above and below these points is where the codes 0 and 127 are defined by the upper and lower threshold (+/−0.5) comparators. This will cause the output codes to have the correct progression, as noted above for the ideal case.

Figure 5:
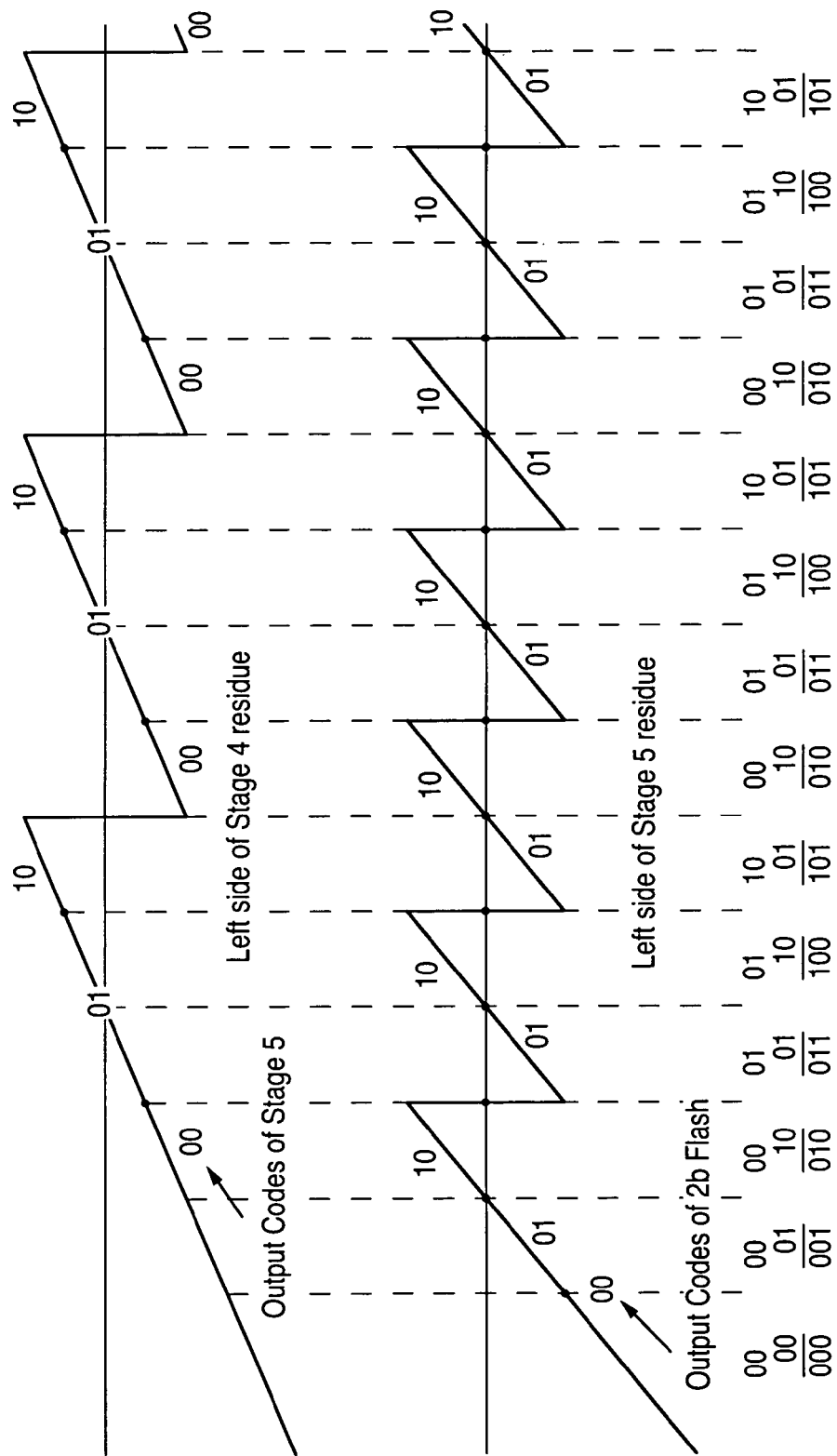
FIG. 5 illustrates endpoint correction for the last two sub-converters of the pipelined ADC circuit of FIG. 1.

Referring to FIG. 5, the performances and output codes of the last two sub-converter stages 14d, 14e and the final ADC 16 can be better understood. The top graph depicts the left side of the stage 4 residue signal with the corresponding output codes of stage 5, while the bottom graph depicts the left side of the stage 5 residue signal with the corresponding output codes of the two-bit final ADC 16. Stage 5 has the typical comparators with thresholds of +0.25 and −0.25 volts, with the resulting output codes having the progression of 00, 01, 10, 00, . . . . The final ADC 16 (e.g., flash converter), uses endpoint correction (e.g., as described in U.S. Pat. No. 6,710,732, incorporated herein by reference) with comparator thresholds of −0.5 volt, 0 volt and +0.5 volt, producing an output code with a progression of 00, 01, 10, 01, . . . . Summing these two progressions between the trip points produces a sum progression of 000, 001, 010, 011, 100, 101, 010, and so on with the pattern of 011, 100, 101, 010 repeating until the end at which the pattern become 110, 111.

Figure 6:
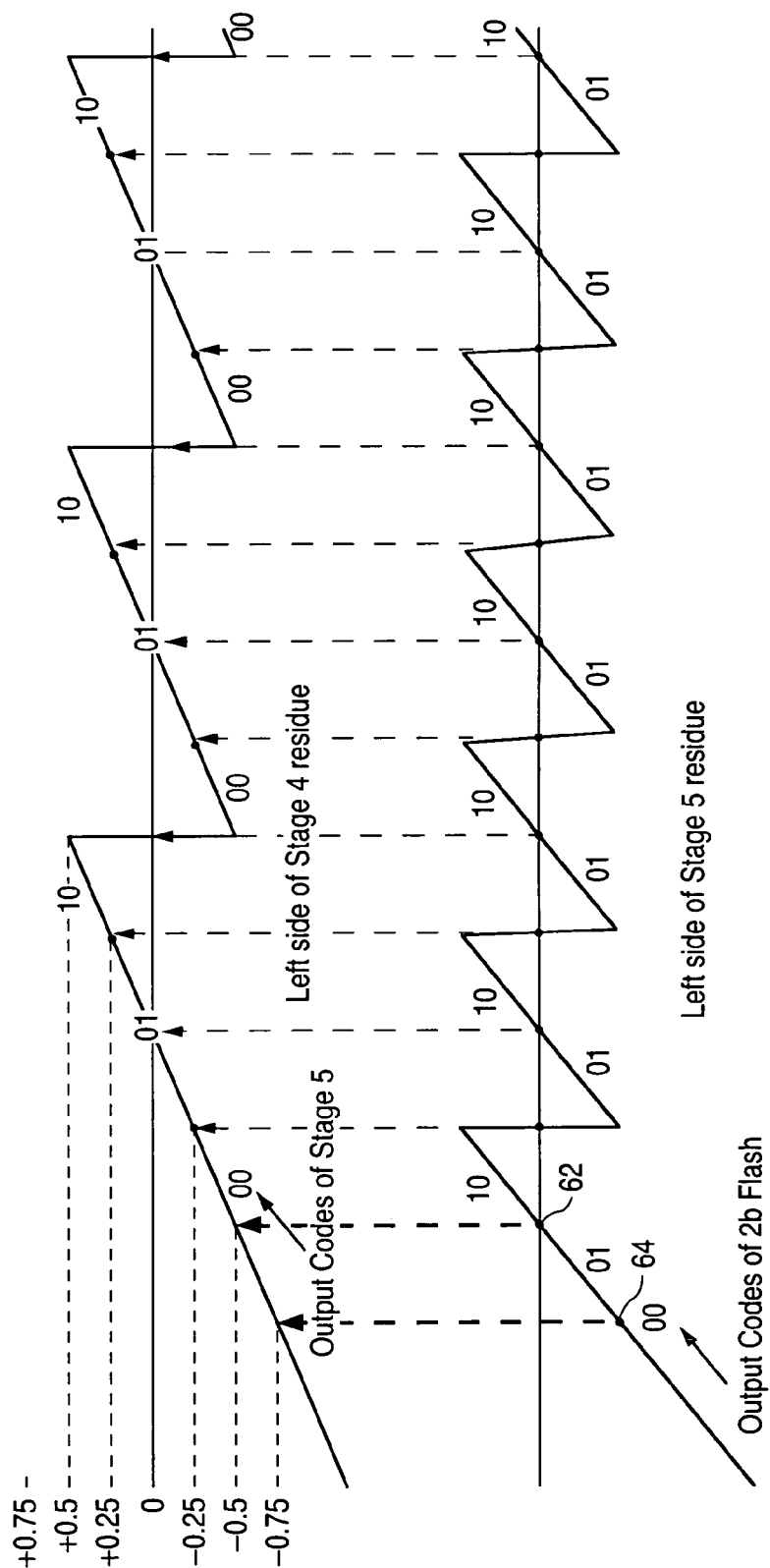
FIG. 6 illustrates endpoint correction for a pipelined ADC circuit in accordance with one embodiment of the presently claimed invention.

Referring to FIG. 6, the last sub-converter 14e can be eliminated if the voltage comparison thresholds are mapped back from the final ADC 16 to the residue signal of Stage 4 14d. These mappings are illustrated by the vertical dashed arrows. All of the zero crossing trip points of the Stage 5 residue signal as seen by the final ADC can be mapped to either a 0, −0.25 or +0.25 crossing on the Stage 4 residue signal, except one zero crossing 62 that maps to a −0.5 crossing. The −0.5 crossing 64 maps to a −0.75 crossing on the Stage 4 residue signal. For purposes of symmetry, the 0 and +0.5 crossings at the high end (not shown) of the residue map to +0.5 and +0.75 crossings, respectively.

Figure 9:
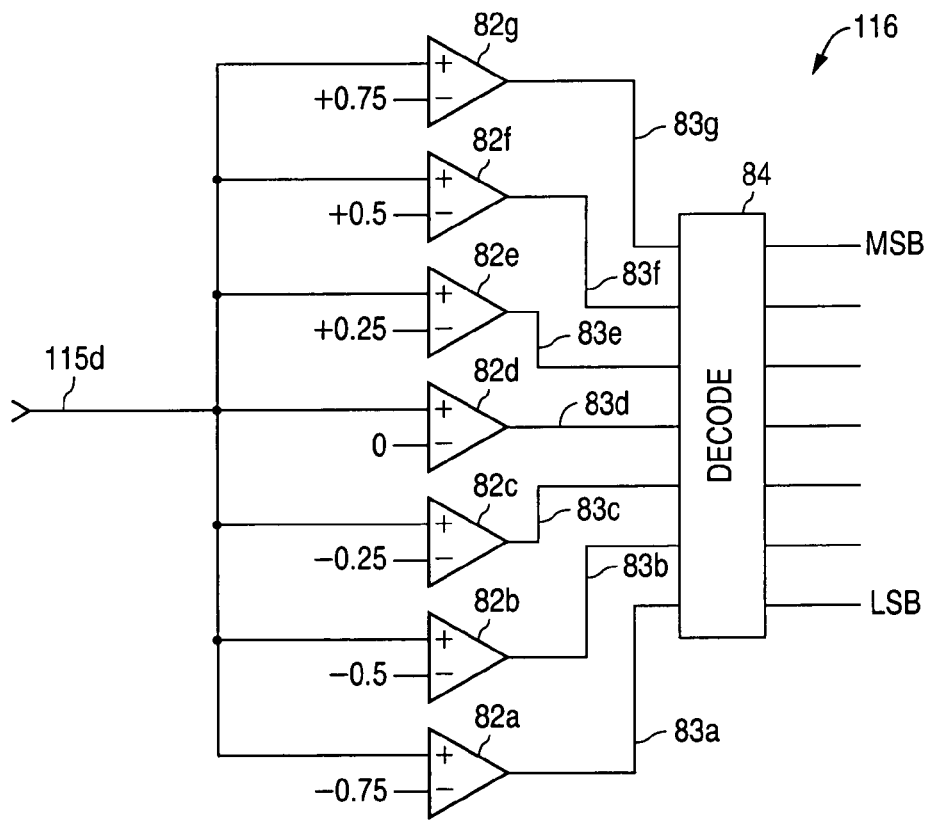
FIG. 9 is a block diagram of the final ADC stage for a pipelined ADC circuit in accordance with one embodiment of the presently claimed invention.
Figure 7:
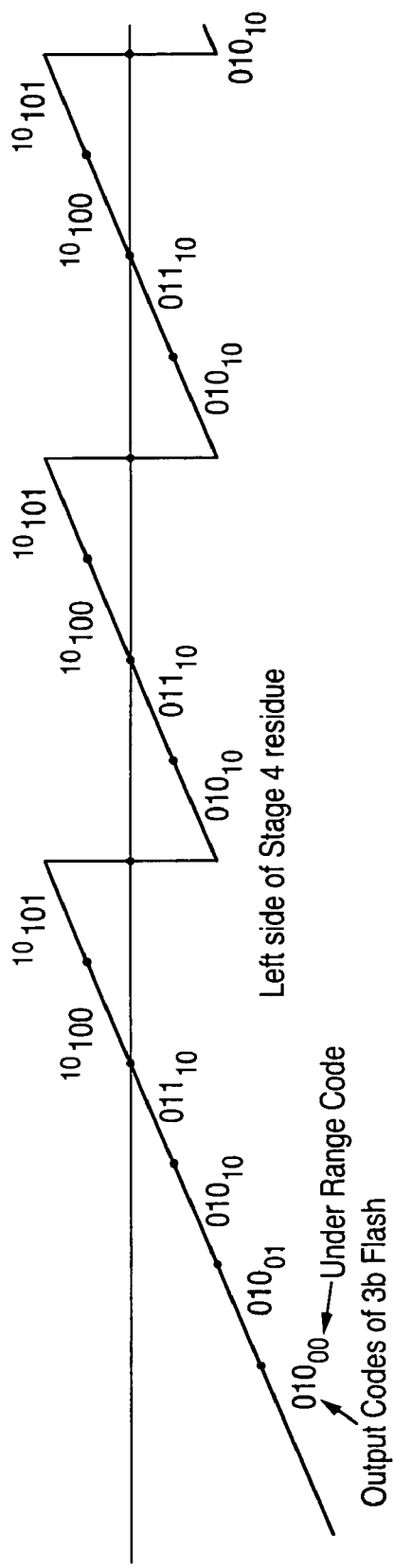
FIG. 7 illustrates the use of under-range and over-range codes for a pipelined ADC circuit in accordance with one embodiment of the presently claimed invention.
Figure 8:
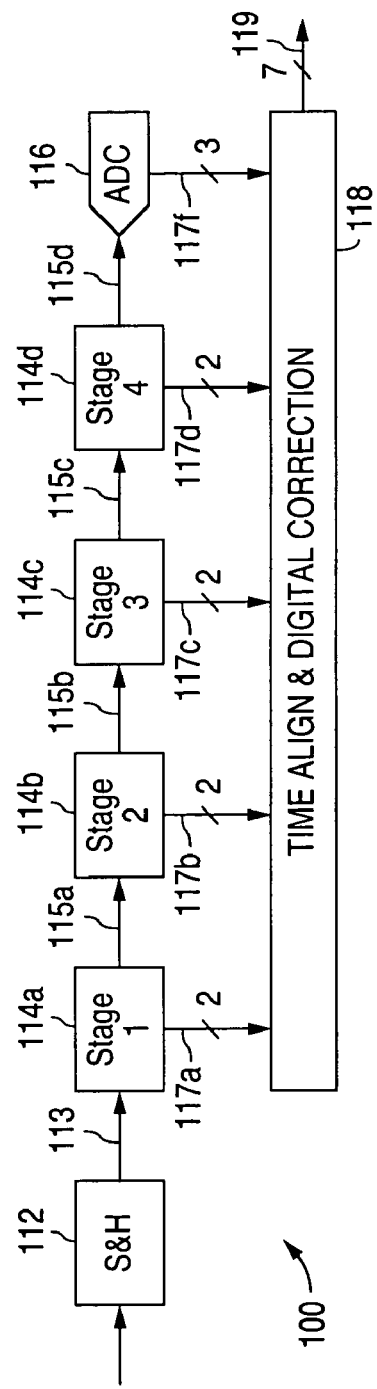
FIG. 8 is a block diagram of a pipelined ADC circuit in accordance with one embodiment of the presently claimed invention.

Referring to FIGS. 7, 8 and 9, with such mappings of the comparison thresholds, the last sub-converter stage 14e (FIG. 1) can be eliminated by using a final ADC 116 with 2M+1 bits (2M+1=3 for this example) with thresholds of −0.75, −0.5, −0.25, 0, +0.25, +0.5 and 0.75 volts. It should be understood that the comparators associated with the thresholds of −0.5, −0.25, +0.25 and +0.5 volts are not new, but previously existed in the original final ADC 16 (FIG. 1). Hence, only two new comparators are needed, those associated with the thresholds of −0.75 and +0.75 volts.

Using the final ADC stage 116 for providing the 2M+1 LSBs produces the same composite progression of output codes as discussed above for the conventional architecture in which the final ADC provided the 2M LSBs (FIG. 5 and associated discussion), i.e., 000, 001, 010, 011, 100, 101, 010, and so on, with the pattern of 011, 100, 101, 010 repeating to the end at which it becomes 110, 111.

Similar to the conventional pipelined ADC (FIG. 1), in the event of errors in the comparators or comparisons associated with the −0.5 or +0.5 voltage thresholds, one or more anomalies in the monotonicity of the output codes will occur. Similar to the conventional pipelined ADC, however, this can be solved by ignoring the output signals 83a, 83b, 83f, 83g of the comparators 82a, 82b, 82f, 82g associated with thresholds of −0.75, −0.5, +0.5 and +0.75 volts, except if the total ADC code is 2 or 125.

To implement the endpoint correction, the output codes from the final ADC 116 are modified slightly as shown in FIG. 7. Additionally, an under-range code 00, 01, 10 is provided, as well as an over-range code 01, 10, 11 for symmetry. For example, in the pipelined ADC 100 of FIG. 8 in which a 7-bit output signal 119 provided, if the 7-bit code 119 is found to be equal to 2, then the two LSBs of the final ADC output code 117f are replaced with the under-range code. Similarly, if the 7-bit output code 119 is found to be equal to 125, than the two LSBs of the final ADC output code 117f are replaced with the over-range code.

Based upon the foregoing discussion, it should be understood that the comparators associated with the −0.25 and +0.25 volt thresholds can be the same as those originally forming a part of Stage 5 of the conventional pipeline ADC (FIG. 1). Accordingly, the error range associated with these comparators is unchanged. However, the error correction range of the zero crossing comparator is reduced, since the signal applied to this comparator no longer benefits from the signal gain that the original Stage 5 provided. Further, while the endpoint comparators have full correction ranges, they do not produce a symmetrical DNL error, since they are set to the ideal trip points. On the other hand, this can be compensated, at least in part, by increasing the physical sizes of the input devices of this comparator, and further, is partially offset by the elimination of the sources of error associated with the original Stage 5 sub-converter.

It should be further understood that the advantages provided by the presently claimed invention include elimination of the last sub-converter stage while only requiring the addition of two comparators thereby substantially reducing overall circuit area, power consumption and complexity, particularly when implemented in a low-bit-count pipelined ADC. For example, simulations have shown that a pipelined ADC fabricated in a 0.25 micron complementary metal oxide semiconductor (CMOS) process will have an integrated circuit area reduced by approximately 15%, and a power consumption reduced by approximately 11%.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a pipelined analog-to-digital converter (ADC), comprising:
    a plurality of pipeline stages coupled in series and including a first pipeline stage, at least one intermediate pipeline stage and a last pipeline stage, each of which provides M bits of resolution for an N-bit digital output signal corresponding to an analog input signal, wherein
        said first pipeline stage is responsive to said analog input signal by providing a first analog residue signal and a first digital signal with M+1 bits corresponding to M+1 most significant bits (MSBs) of said N-bit digital output signal,
        each of said at least one intermediate pipeline stage is responsive to a prior analog residue signal from a directly preceding one of said plurality of pipeline stages by providing a subsequent analog residue signal and an intermediate digital signal with M+1 bits corresponding to M+1 less significant intermediate bits of said N-bit digital output signal, and
        said last pipeline stage is responsive to a last subsequent analog residue signal by providing a final analog residue signal and a last digital signal with M+1 bits corresponding to M+1 lesser significant intermediate bits of said N-bit digital output signal; and
    a final ADC coupled to said last pipeline stage and responsive to said final analog residue signal by providing a final digital signal with 2M+1 bits corresponding to 2M+1 least significant bits (LSBs) of said N-bit digital output signal.

2. The apparatus of claim 1, wherein said plurality of pipeline stages comprises a plurality of N−2M−1 pipeline stages.

3. The apparatus of claim 1, wherein each of said first, at least one intermediate and last pipeline stages comprises:
    an input electrode via which an incoming analog signal is conveyed;
    ADC circuitry coupled to said input electrode and responsive to said incoming analog signal by providing a corresponding digital approximation signal with said M+1 bits;
    DAC circuitry coupled to said ADC circuitry and responsive to said digital approximation signal by providing a corresponding analog approximation signal;
    combiner circuitry coupled to said input electrode and said DAC circuitry, and responsive to said incoming analog signal and said analog approximation signal by combining said incoming analog signal and said analog approximation signal to provide an outgoing analog signal; and
    amplifier circuitry coupled to said combiner circuitry and responsive to said outgoing analog signal by providing said analog residue signal.

4. The apparatus of claim 3, wherein said ADC circuitry comprises a multi-bit flash ADC circuit.

5. The apparatus of claim 3, wherein said amplifier circuitry comprises an analog amplifier circuit with a signal gain of 2M.

6. The apparatus of claim 1, wherein said final ADC comprises a flash ADC circuit.

7. The apparatus of claim 1, wherein said final ADC comprises:
    a plurality of $2^{(2M+1)}-1$ signal comparator circuits responsive to said final analog residue signal by providing an intermediate digital signal with $2^{(2M+1)}$ bits corresponding to a comparison of said final analog residue signal with $2^{(2M-1)}-1$ signal thresholds; and
    decoding circuitry coupled to said plurality of $2^{(2M+1)}-1$ signal comparator circuits and responsive to said intermediate digital signal by providing said final digital signal.

8. An apparatus including a pipelined analog-to-digital converter (ADC), comprising:
    first pipeline means for receiving an analog input signal and in response thereto generating a first analog residue signal and a first digital signal with M+1 bits corresponding to M+1 most significant bits (MSBs) of an N-bit digital output signal;
    at least one intermediate pipeline means each of which is for receiving a prior analog residue signal from a directly preceding pipeline means and in response thereto generating a subsequent analog residue signal and an intermediate digital signal with M+1 bits corresponding to M+1 less significant intermediate bits of said N-bit digital output signal;
    last pipeline means for receiving a last subsequent analog residue signal and in response thereto generating a final analog residue signal and a last digital signal with M+1 bits corresponding to M+1 lesser significant intermediate bits of said N-bit digital output signal; and
    final ADC means for receiving said final analog residue signal and in response thereto generating a final digital signal with 2M+1 bits corresponding to 2M+1 least significant bits (LSBs) of said N-bit digital output signal.

9. An apparatus including a pipelined analog-to-digital converter (ADC), comprising:
    first, second, third and fourth 10.5-bit pipeline stages coupled in series, each of which provides one bit of resolution for a 7-bit digital output signal corresponding to an analog input signal, wherein
        said first pipeline stage is responsive to said analog input signal by providing a first analog residue signal and a first digital signal with 2 bits corresponding to a most significant bit (MSB) of said 7-bit digital output signal,
        said second and third pipeline stages are responsive to said first analog residue signal and a second analog residue signal by providing said second analog residue signal and a third analog residue signal and second and third digital signals with 2 bits, respectively, corresponding to second and third less significant bits of said 7-bit digital output signal, and
        said fourth pipeline stage is responsive to said third analog residue signal by providing a fourth analog residue signal and a fourth digital signal with 2 bits corresponding to a fourth less significant bit of said 7-bit digital output signal; and
    a final ADC coupled to said fourth pipeline stage and responsive to said fourth analog residue signal by providing a fifth digital signal with tree bits corresponding to three least significant bits (LSBs) of said 7-bit digital output signal.

10. The apparatus of claim 9, wherein each of said first, second, third and fourth pipeline stages comprises:
    an input electrode via which an incoming analog signal is conveyed;
    ADC circuitry coupled to said input electrode and responsive to said incoming analog signal by providing a corresponding digital approximation signal with said 2 bits;

DAC circuitry coupled to said ADC circuitry and responsive to said digital approximation signal by providing a corresponding analog approximation signal;

combiner circuitry coupled to said input electrode and said DAC circuitry, and responsive to said incoming analog signal and said analog approximation signal by combining said incoming analog signal and said analog approximation signal to provide an outgoing analog signal; and amplifier circuitry coupled to said combiner circuitry and responsive to said outgoing analog signal by providing said analog residue signal.

11. The apparatus of claim 10, wherein said ADC circuitry comprises a 3-bit flash ADC circuit.

12. The apparatus of claim 10, wherein said amplifier circuitry comprises an analog amplifier circuit with a signal gain of 2.

13. The apparatus of claim 9, wherein said final ADC comprises a flash ADC circuit.

14. The apparatus of claim 9, wherein said final ADC comprises:

a plurality of 7 signal comparator circuits responsive to said final analog residue signal by providing an intermediate digital signal with 8 bits corresponding to a comparison of said final analog residue signal with 7 signal thresholds; and decoding circuitry coupled to said plurality of 7 signal comparator circuits and responsive to said intermediate digital signal by providing said final digital signal.

15. An apparatus including a pipelined analog-to-digital converter (ADC), comprising:

first pipeline means for receiving an analog input signal and in response thereto generating a first analog residue signal and a first digital signal with 2 bits corresponding to a most significant bit (MSB) of a 7-bit digital output signal;

second and third pipeline means for receiving said first analog residue signal and a second analog residue signal and in response thereto generating said second analog residue signal and a third analog residue signal and second and third digital signals with 2 bits, respectively, corresponding to second and third less significant bits of said 7-bit digital output signal;

fourth pipeline means for receiving said third analog residue signal and in response thereto generating a fourth analog residue signal and a fourth digital signal with 2 bits corresponding to a fourth less significant bit of said 7-bit digital output signal; and final ADC means for receiving said fourth analog residue signal and in response thereto generating a fifth digital signal with three bits corresponding to three least significant bits (LSBs) of said 7-bit digital output signal.

* * * * *

UNITED STATES PATENT AND TRADEMARK OFFICE
CERTIFICATE OF CORRECTION

PATENT NO. : 6,987,477 B1
DATED : January 17, 2006
INVENTOR(S) : Ario Aude

It is certified that error appears in the above-identified patent and that said Letters Patent is hereby corrected as shown below:

Column 8,
Line 57, delete "tree" and insert -- three --.

Signed and Sealed this

Twenty-eighth Day of March, 2006

JON W. DUDAS
*Director of the United States Patent and Trademark Office*